(12) United States Patent
Chen et al.

(10) Patent No.: US 11,181,834 B2
(45) Date of Patent: Nov. 23, 2021

(54) ALIGNMENT STRUCTURE

(71) Applicant: PlayNitride Display Co., Ltd., MiaoLi County (TW)

(72) Inventors: Yen-Yeh Chen, MiaoLi County (TW); Shiang-Ning Yang, MiaoLi County (TW); Chih-Ling Wu, MiaoLi County (TW); Yu-Ya Peng, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/086,464

(22) Filed: Nov. 2, 2020

(65) Prior Publication Data

US 2021/0325792 A1 Oct. 21, 2021

(30) Foreign Application Priority Data

Apr. 21, 2020 (TW) ................................. 109113253

(51) Int. Cl.
*G03F 9/00* (2006.01)
(52) U.S. Cl.
CPC .................................. *G03F 9/7076* (2013.01)
(58) Field of Classification Search
CPC ........................................................ G03F 9/7076
See application file for complete search history.

(56) References Cited

U.S. PATENT DOCUMENTS

| | | | | |
|---|---|---|---|---|
| 4,824,254 A | * | 4/1989 | Ohtsuka | G03F 9/7076 257/E21.211 |
| 2002/0142235 A1 | * | 10/2002 | Hamanaka | G03F 9/7076 430/5 |
| 2017/0125300 A1 | * | 5/2017 | Kim | H01L 23/544 |

FOREIGN PATENT DOCUMENTS

| | | |
|---|---|---|
| CN | 1567096 | 1/2005 |
| CN | 200983364 | 11/2007 |
| CN | 101840886 | 9/2010 |
| CN | 110349874 | 10/2019 |
| CN | 110908255 | 3/2020 |
| JP | H06112301 | 4/1994 |
| JP | 2002305139 | 10/2002 |
| TW | 200907608 | 2/2009 |
| TW | 201715639 | 5/2017 |
| TW | 202002229 | 1/2020 |

OTHER PUBLICATIONS

"Office Action of Taiwan Counterpart Application", dated Feb. 8, 2021, pp. 1-5.
"Office Action of China Counterpart Application", dated May 31, 2021, p. 1-p. 7.

\* cited by examiner

*Primary Examiner* — Steven Whitesell Gordon
(74) *Attorney, Agent, or Firm* — JCIPRNET

(57) ABSTRACT

An alignment structure is provided. The alignment structure includes a substrate, an alignment portion, and an extension portion. The alignment portion is disposed on the substrate. The extension portion is disposed on the substrate. The extension portion at least partially surrounds the alignment portion and is spaced apart from the alignment portion by a void. A side of the extension portion adjacent to the alignment portion and a side of the alignment portion adjacent to the extension portion are conformal to each other.

10 Claims, 4 Drawing Sheets

ALIGNMENT STRUCTURE

CROSS-REFERENCE TO RELATED APPLICATION

This application claims the priority benefit of Taiwan application no. 109113253, filed on Apr. 21, 2020. The entirety of the above-mentioned patent application is hereby incorporated by reference herein and made a part of this specification.

BACKGROUND

Technical Field

The disclosure relates to an alignment structure.

Description of Related Art

An alignment structure (or referred to as an alignment key) plays an important role in manufacturing processes such as photolithography alignment. Generally, the alignment structure is manufactured by directly sputtering metal or etching a pattern. However, after some processes, the metal or pattern will become invisible, or the height difference between the alignment structure and the surrounding structure will cause the photoresist coating surrounding the alignment structure to be thinner, and such non-uniform coating will cause color difference. As a result, the identification of the alignment structure may be inaccurate, which thus leads to a poor yield.

SUMMARY

The disclosure provides an alignment structure in which an extension portion is used to avoid non-uniform photoresist coating.

According to an embodiment of the disclosure, an alignment structure includes a substrate, an alignment portion, and an extension portion. The alignment portion is disposed on the substrate. The extension portion is disposed on the substrate. The extension portion at least partially surrounds the alignment portion and is spaced apart from the alignment portion by a void. A side of the extension portion adjacent to the alignment portion and a side of the alignment portion adjacent to the extension portion are conformal to each other.

Based on the above, compared to the conventional alignment structure, the alignment structure provided by the embodiments of the disclosure further includes the extension portion, so that the photoresist at the surrounding of the alignment portion for photolithography alignment is not too thin, and color difference does not occur at this position and affects the identification of the alignment portion.

To make the aforementioned more comprehensible, several embodiments accompanied with drawings are described in detail as follows.

DESCRIPTION OF THE EMBODIMENTS

Figure 1A:
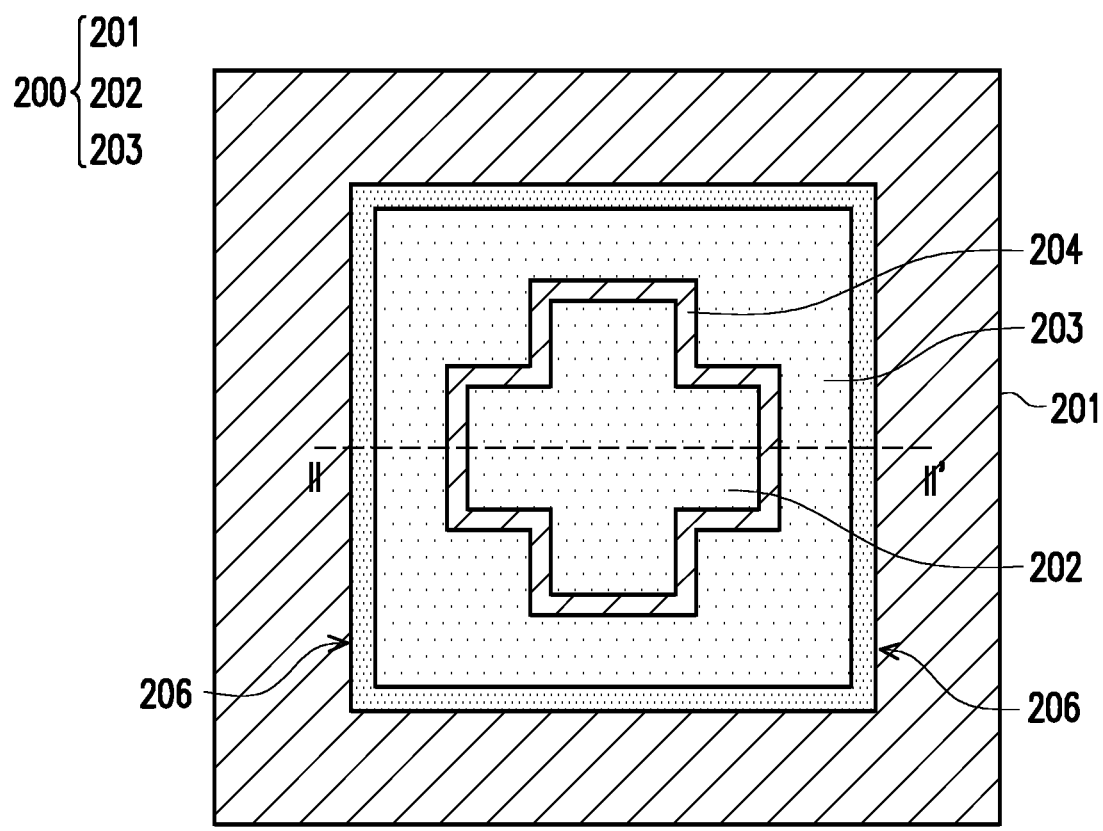
FIG. 1A is a plan view showing an alignment structure coated with a photoresist according to a first embodiment of the disclosure.
Figure 1B:
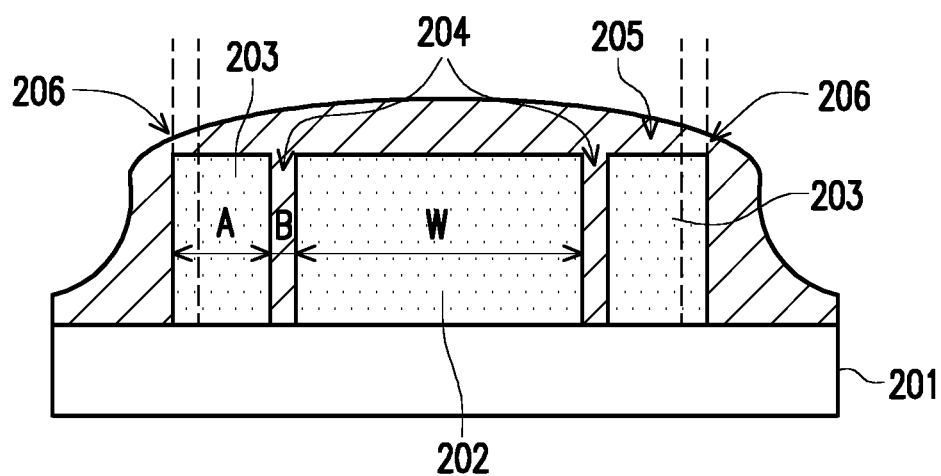
FIG. 1B is a cross-sectional view taken along broken line II-II' in FIG. 1A.

Referring to FIG. 1A and FIG. 1B, FIG. 1A is a plan view showing an alignment structure coated with a photoresist according to a first embodiment of the disclosure, and FIG. 1B is a cross-sectional view taken along broken line II-II' in FIG. 1A.

According to the first embodiment of the disclosure, an alignment structure 200 includes a substrate 201, an alignment portion 202, and an extension portion 203. The alignment portion 202 is disposed on the substrate 201, and the extension portion 203 is disposed on the substrate 201. The extension portion 203 at least partially surrounds the alignment portion 202 and is spaced apart from the alignment portion 202 by a void 204. A side of the extension portion 203 adjacent to the alignment portion 202 and a side of the alignment portion 202 adjacent to the extension portion 203 are conformal to each other. In other words, as shown in FIG. 1A, the side of the alignment portion 202 adjacent to the extension portion 203 is in a cross shape, and the side of the extension portion 203 adjacent to the alignment portion 202 is also in a cross shape.

Referring to FIG. 1B, the coating of a photoresist 205 above the void 204 between the alignment portion 202 and the extension portion 203 is not thinner, but the photoresist 205 is thinner only on the outer side (as indicated by the broken lines in FIG. 1B) of the extension portion 203. In contrast, without the extension portion 203, the photoresist coating would be thinner on the outer side of the alignment portion 202, and at the time of photolithography alignment, color difference would occur at the thinner coating, so that alignment cannot be accurately performed. Therefore, when the alignment structure 200 provided in this embodiment is viewed from the plan view (FIG. 1A), color difference does not occur at the side of the alignment portion 202 and the side of the extension portion 203 adjacent to the void 204, but color difference occurs only on an extension portion outer side 206 (in FIG. 1A, the extension portion outer side 206 is rendered in black dots to indicate the presence of color difference). Particularly, in the case of conformality, the photoresist coating on the outer side of the alignment portion 202 can be more uniform, and the shape of the side of the alignment portion 202 adjacent to the extension portion 203 (when viewed from the plan view, the shape is the "contour" of the alignment portion 202) can be clearly shown, so that alignment can be accurately performed. Specifically, the substrate 201 may be a temporary substrate such as a silicon substrate, a plastic substrate, a glass substrate, or a sapphire substrate. In a manufacturing process of a semiconductor device, the alignment structure 200 provides alignment identification in a photolithography process. An adhesive layer may be provided between the alignment portion, the extension portion, and the substrate, so that when the alignment portion is unclear due to the adhesive layer, the extension portion can also be used as an auxiliary for accurate alignment with the alignment portion.

Figure 1C:
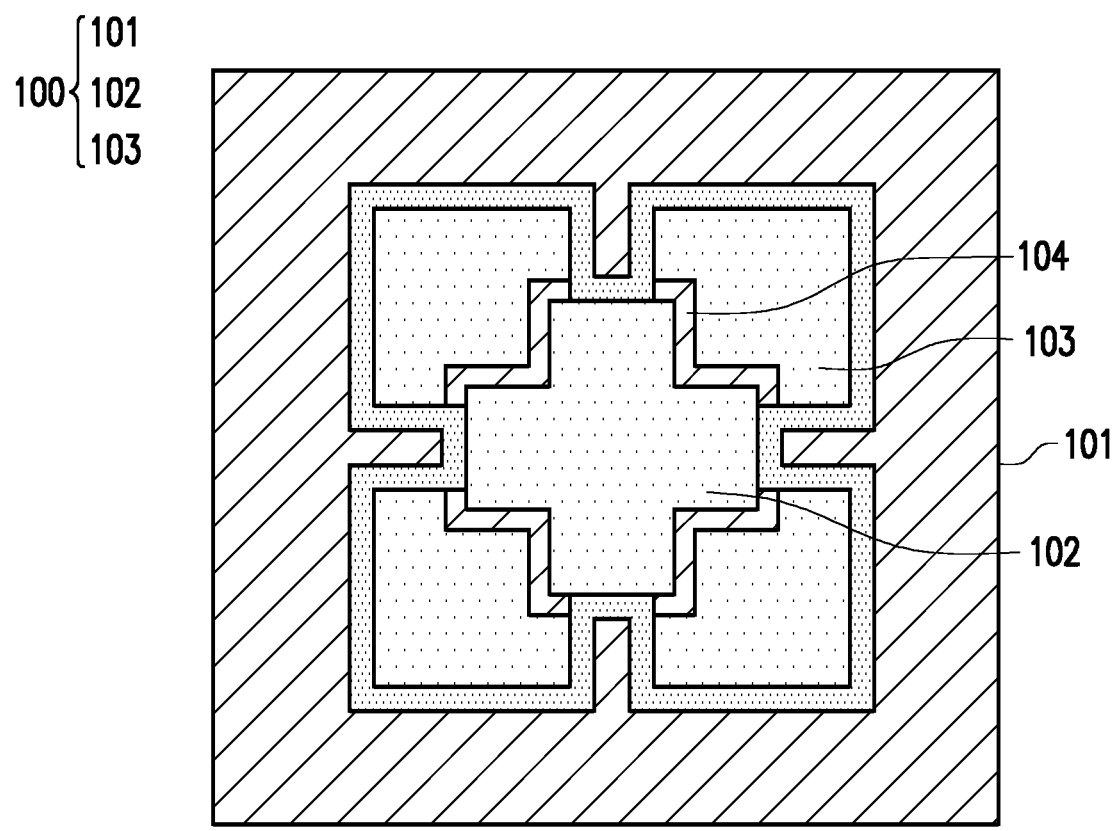
FIG. 1C is a plan view showing an alignment structure coated with a photoresist according to an embodiment of the disclosure.

It is noted that although the extension portion 203 in FIG. 1A is disposed to fully surround the alignment portion 202, the disclosure is not limited thereto, and it is also possible that the extension portion only partially surrounds the alignment portion. As shown in FIG. 1C, an alignment structure 100 includes a substrate 101, an alignment portion 102, and an extension portion 103. The extension portion 103 partially surrounds the alignment portion 102. Although color difference represented by black dots occurs on the surrounding of the extension portion 103 and part of the contour of the alignment portion 102, since a void 104 is formed between the rest of the contour of the alignment portion 102 and the extension portion 103, the rest of the contour can be clearly shown without color difference, and thereby alignment errors can be avoided.

Figure 1D:
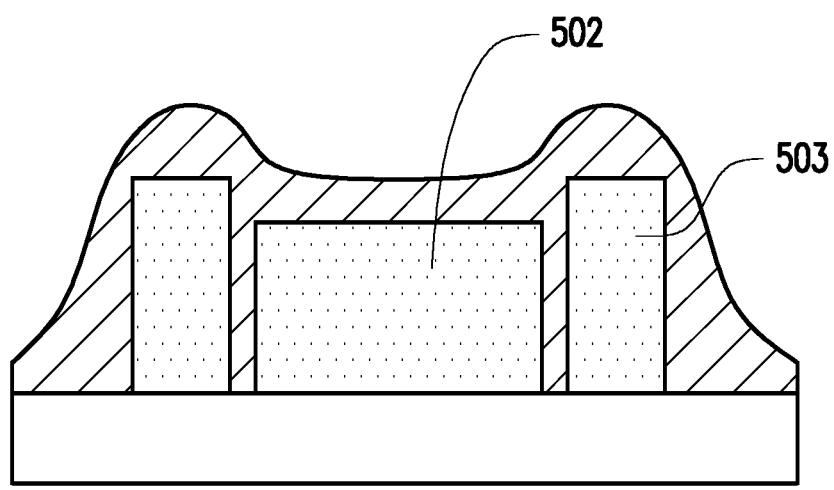
FIG. 1D is a cross-sectional view showing an alignment structure coated with a photoresist according to an embodiment of the disclosure.

Next, referring to FIG. 1B again, the height of the extension portion 203 in the normal direction of the substrate 201 is equal to the height of the alignment portion 202, but the disclosure is not limited thereto. Referring to FIG. 1D, in FIG. 1D, the height of an extension portion 503 is greater than the height of an alignment portion 502. Therefore, the photoresist coating of the alignment portion 502 is more uniform, color difference is less likely to occur, and the contour of the alignment portion 502 is clearer. Preferably, the height ratio of the alignment portion to the extension portion in the normal direction of the substrate falls within the range of 0.5 to 1, the height difference between the two is less than 1 μm, and the height of the extension portion 203 is less than or equal to 50 μm. If the height of the extension portion is greater than 50 μm, the subsequent photoresist coating thickness is needed to be designed accordingly, which may cause manufacturing difficulty and be easy to cause identification errors. Preferably, the height of the extension portion is less than or equal to 20 μm, which can generate better identification. When the height ratio of the alignment portion to the extension portion is too small, it would affect the identification of the alignment portion. When the height ratio is too large, the effect of improving the uniformity of the photoresist coating would be insufficient.

Referring to FIG. 1B again, a width A of the extension portion 203 in a direction perpendicular to the normal of the substrate 201 is less than a width W of the alignment portion 202 in this direction, so that the extension portion 203 does not takes up too much space in this direction and interfere with the alignment operation. Preferably, the width ratio (A/W) of the extension portion 203 to the alignment portion 202 in this direction is greater than or equal to 0.2 and is less than or equal to 10. If the width ratio is less than 0.2, the effect of uniformity of the photoresist coating would be insufficient, and if the width ratio is greater than 10, too much space would be taken up. However, in an embodiment not shown, the width A of the extension portion 203 in the direction perpendicular to the normal of the substrate 201 may be greater than the width W of the alignment portion 202 in this direction, but the disclosure is not limited thereto. In addition, in the direction perpendicular to the normal of the substrate 201, the width A of the extension portion 203 and a width B of the void 204 satisfy the following relationships, so that the uniformity of the photoresist coating can be increased while the extension portion 203 and the void 204 do not take up too much space:

$$5 \ \mu m \leq A$$

$$0.001 \ \mu m < B < 50 \ \mu m.$$

Figure 1E:
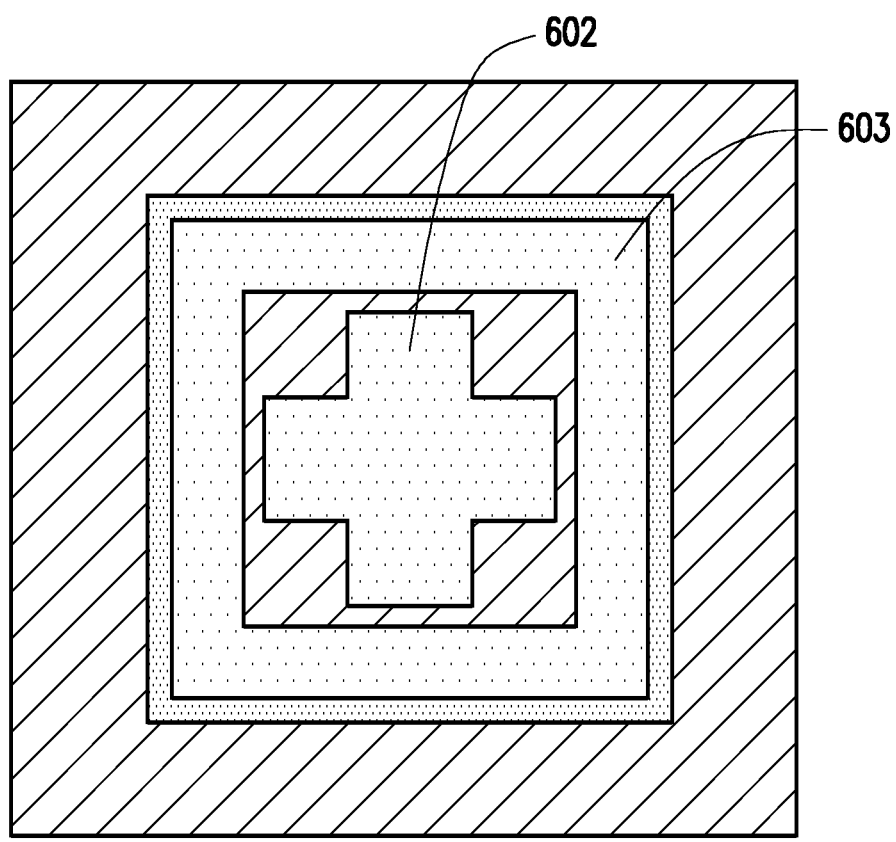
FIG. 1E is a schematic plan view showing configurations of an alignment portion and an extension portion according to an embodiment of the disclosure.

In addition, in FIG. 1A, a side of the extension portion 203 away from the alignment portion 202 is a rectangle rather than a cross pattern. In other words, the side of the extension portion 203 away from the alignment portion 202 is in a different shape from the alignment portion 202, so that the extension portion 203 is not mistaken for the alignment portion 202 at the time of photolithography alignment. However, the disclosure is not limited thereto. Referring to FIG. 1E, a side of an extension portion 603 adjacent to an alignment portion 602 is a rectangle rather than a cross pattern like the contour of the alignment portion 602. In other words, the side of the extension portion adjacent to the alignment portion and the side of the alignment portion adjacent to the extension portion may also be in different shapes. Moreover, the shape of the alignment portion is not necessarily a cross shape, and may also be a polygon such as a diamond or a rectangle, as long as it is sufficient for alignment, and the disclosure is not limited thereto.

According to an embodiment of the disclosure, the extension portion may include a semiconductor material, a metal, a dielectric material, or an organic material, or may be formed of the material forming the alignment portion to simplify the manufacturing process and increase the yield. More preferably, the alignment portion and the extension portion are formed in the same process.

In FIG. 1A and FIG. 1B, the void 204 may be filled with a material different from those of the alignment portion 202 and the extension portion 203, such as a metal. In that case, with the difference in the reflectance of the material in the void 204 and the reflectance of the material forming the alignment portion 202 and the extension portion 203, the identification of the contour of the alignment portion 202 can be improved.

Figure 2:
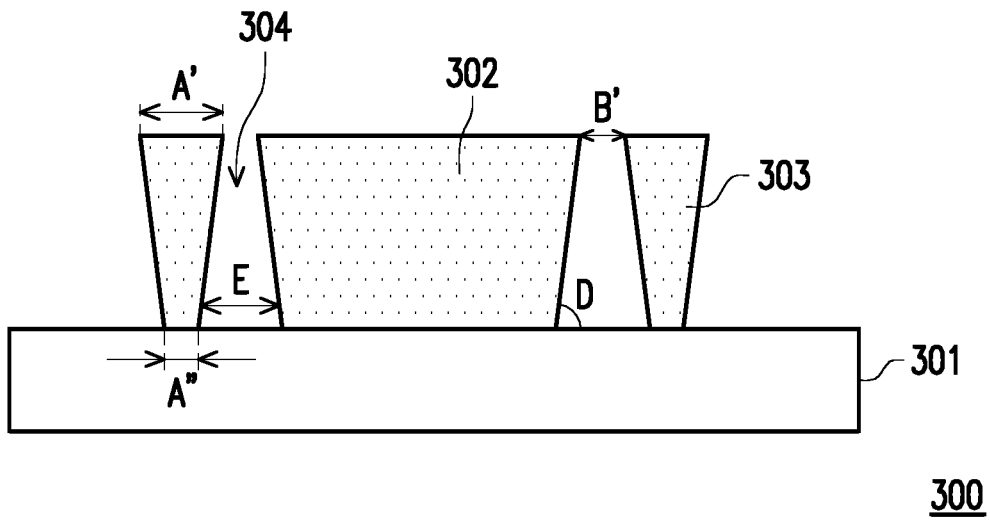
FIG. 2 is a cross-sectional view showing an alignment structure according to a second embodiment of the disclosure.

Next, referring to FIG. 2, FIG. 2 is a cross-sectional view showing an alignment structure 300 according to a second embodiment of the disclosure. In order to facilitate the understanding of the concept of the disclosure, in the second embodiment, only the parts different from the first embodiment will be described, and the parts that are the same as or similar to the first embodiment will not be repeatedly described.

In FIG. 2, the widths of an alignment portion 302 and an extension portion 303 in the direction perpendicular to the normal of a substrate 301 gradually increase as the distance from the substrate 301 increases, to respectively form inverted trapezoid shapes. Also, in this direction, the width of a void 304 gradually decreases as the distance from the substrate 301 increases.

According to this embodiment, the ratio of a width minimum B' to a width maximum E of the void 304 in the direction perpendicular to the normal of the substrate 301 is greater than or equal to 0.3 and is less than 1. If the width minimum B' of the void 304 is too small, when the photoresist is coated, the photoresist would not stably fill the bottom of the void 304. According to this embodiment, the width minimum B' of the void 304 is greater than 0.001 μm and less than 50 μm, so as to obtain better uniformity of the photoresist coating and identification accuracy of the alignment portion 302. According to this embodiment, a width minimum A" and a width maximum A' of the extension portion 303 in the direction perpendicular to the normal of the substrate 301 satisfy the following conditional expressions:

$$5 \ \mu m \leq A';$$

$$0.001 \ \mu m \leq A'' < A'; \ \text{and}$$

$$0.3 \leq A''/A' \leq 1.$$

According to this embodiment, an angle D between the inverted trapezoidal structure of the alignment portion 302 and the substrate 301 satisfies the relationship 30°<D<90°, so that the angle D would not be so small that the photoresist could not stably and fully fill the bottom of the void 304.

Figure 3:
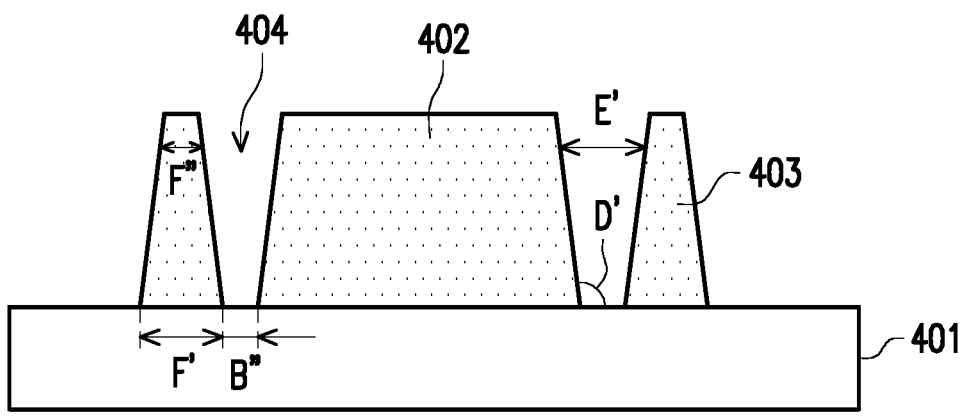
FIG. 3 is a cross-sectional view showing an alignment structure according to a third embodiment of the disclosure.

Next, referring to FIG. 3, FIG. 3 is a cross-sectional view showing an alignment structure 400 according to a third embodiment of the disclosure. In FIG. 3, the widths of an alignment portion 402 and an extension portion 403 in the direction perpendicular to the normal of a substrate 401 gradually decrease as the distance from the substrate 401 increases, to respectively form trapezoid shapes. Also, in this direction, the width of a void 404 gradually increases as the distance from the substrate 401 increases.

According to this embodiment, the ratio of a width minimum B" to a width maximum E' of the void 404 in the direction perpendicular to the normal of the substrate 401 is greater than or equal to 0.3 and is less than 1. If the width minimum B" of the void 404 is too small, the effect of improving the uniformity of the photoresist coating would be insufficient. According to this embodiment, the width maximum E' of the void 404 is greater than 0.001 μm and less than 50 μm, and the width minimum B" of the void 404 is greater than 0.001 μm and less than the width maximum E' so as to obtain better uniformity of the photoresist coating and identification accuracy of the alignment portion 402. According to this embodiment, a width minimum F" and a width maximum F' of the extension portion 403 in the direction perpendicular to the normal of the substrate 401 satisfy the following conditional expressions:

$$5 \ \mu m \leq F';$$

$$0.001 \ \mu m \leq F'' < F'; \text{ and}$$

$$0.3 \leq F''/F' \leq 1.$$

According to this embodiment, an angle D' between the trapezoidal structure of the alignment portion 402 and the substrate 401 satisfies the relationship $90° < D' \leq 150°$, so that the angle D' would not be so large that the effect of improving the uniformity of the photoresist coating would be insufficient.

In summary of the above, compared to the conventional art, the alignment structure provided in the embodiments of the disclosure further includes the extension portion. The configuration of the extension portion makes the photoresist coating more uniform and improves the accuracy of identifying the alignment portion.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. An alignment structure comprising:
a substrate;
an alignment portion disposed on the substrate; and
an extension portion disposed on the substrate, wherein the extension portion at least partially surrounds the alignment portion and is spaced apart from the alignment portion by a void,
wherein an outer side contour of the extension portion away from the alignment portion and an outer side contour of the alignment portion adjacent to the extension portion are in shapes different from each other.

2. The alignment structure according to claim 1, wherein a height of the extension portion in a first direction is greater than or equal to a height of the alignment portion in the first direction, and the first direction is parallel to a normal direction of the substrate.

3. The alignment structure according to claim 2, wherein a height ratio of the alignment portion to the extension portion in the first direction falls within a range of 0.5 to 1.

4. The alignment structure according to claim 1, wherein a ratio of a width of the extension portion in a second direction to a width of the alignment portion in the second direction is greater than or equal to 0.2 and is less than or equal to 10, and the second direction is perpendicular to a normal direction of the substrate.

5. The alignment structure according to claim 1, wherein widths of the alignment portion and the extension portion in a second direction gradually increase as a distance from the substrate increases, a width of the void in the second direction gradually decreases, and the second direction is perpendicular to a normal direction of the substrate.

6. The alignment structure according to claim 1, wherein widths of the alignment portion and the extension portion in a second direction gradually decrease as a distance from the substrate increases, a width of the void in the second direction gradually increases, and the second direction is perpendicular to a normal direction of the substrate.

7. The alignment structure according to claim 1, wherein a ratio of a minimum value to a maximum value of a width of the void in a second direction is greater than or equal to 0.3 and is less than or equal to 1, and the second direction is perpendicular to a normal direction of the substrate.

8. The alignment structure according to claim 7, wherein the minimum value of the void is greater than 0.001 μm and less than 50 μm.

9. The alignment structure according to claim 1, wherein a side of the extension portion adjacent to the alignment portion and a side of the alignment portion adjacent to the extension portion are conformal to each other.

10. The alignment structure according to claim 1, wherein a side of the extension portion adjacent to the alignment portion and a side of the alignment portion adjacent to the extension portion are in shapes different from each other.

* * * * *